(12) United States Patent
Hwang

(10) Patent No.: US 7,521,717 B2
(45) Date of Patent: Apr. 21, 2009

(54) THIN FILM TRANSISTOR, FLAT PANEL DISPLAY DEVICE, AND METHOD OF FABRICATING THE SAME

(75) Inventor: Eui-Hoon Hwang, Suwon-si (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 79 days.

(21) Appl. No.: 11/394,063

(22) Filed: Mar. 29, 2006

(65) Prior Publication Data

US 2006/0220020 A1     Oct. 5, 2006

(30) Foreign Application Priority Data

Mar. 30, 2005   (KR)   ............... 10-2005-0026688

(51) Int. Cl.
*H01L 29/04* (2006.01)
(52) U.S. Cl. .................. 257/72; 257/59; 257/347; 257/E21.134; 257/E27.111; 257/E29.137; 257/E29.28; 438/151
(58) Field of Classification Search .......... 257/59, 257/72, 347, 351; 348/151, 166; 438/151, 438/166
See application file for complete search history.

(56) References Cited

U.S. PATENT DOCUMENTS 5,536,951 A * 7/1996 Muragishi ............... 257/69

6,600,197 B1 * 7/2003 Nakajima et al. ......... 257/353
2002/0121639 A1 * 9/2002 So et al. .................. 257/72
2002/0125481 A1 * 9/2002 Kimura .................... 257/72
2005/0173762 A1 * 8/2005 Ohishi et al. ............. 257/347
2005/0230685 A1 * 10/2005 Oishi et al. ............... 257/72
2006/0163559 A1 * 7/2006 Koganei et al. ........... 257/40
2007/0252229 A1 * 11/2007 Fujimori et al. .......... 257/489

FOREIGN PATENT DOCUMENTS

| CN | 1655039 A | 8/2005 |
| JP | 2004-320006 | * 11/2004 |
| JP | 2005-228826 | 8/2005 |
| KR | 10-2006-0104477 A | 10/2006 |

OTHER PUBLICATIONS

Chinese Office action dated Mar. 7, 2008, for corresponding China application 200610073815.8, with English translation indicating relevance of listed reference in this IDS.
Chinese Office action dated Aug. 22, 2008, for corresponding China application 200610073815.8, with English translation indicating relevance of U.S. Publication 2002/0125481, cited in the U.S. Office action dated May 16, 2008.

* cited by examiner

*Primary Examiner*—A. Sefer
(74) *Attorney, Agent, or Firm*—Christie, Parker & Hale, LLP

(57) ABSTRACT

A thin film transistor, a flat panel display device including the same, and a method of fabricating the same. An uneven structure is formed at a part of a polycrystalline silicon layer pattern corresponding to a channel region to form a channel length at the edge of the channel region longer than a main channel length, so that a resistance at the edge of the channel region increases to cause an amount of current flowing through the edge of the channel region to decrease, thereby enhancing the reliability of a circuit at low voltage driving.

16 Claims, 4 Drawing Sheets

THIN FILM TRANSISTOR, FLAT PANEL DISPLAY DEVICE, AND METHOD OF FABRICATING THE SAME

CROSS-REFERENCE TO RELATED APPLICATION

This application claims priority to and the benefit of Korean Patent Application No. 10-2005-0026688, filed in the Korean Intellectual Property Office on Mar. 30, 2005, the entire content of which is incorporated herein by reference.

BACKGROUND OF THE INVENTION

1. Field of the Invention

The present invention relates to a thin film transistor, a flat panel display device including the same, and a method of fabricating the same, and, more particularly, to a thin film transistor that is capable of effectively controlling a current, a flat panel display device including the same, and a method of fabricating the same.

2. Description of the Related Art

In an active matrix type flat panel display device, for example, in an active matrix LCD (AMLCD) or an active matrix organic light emitting display (AMOLED) device, a thin film transistor (TFT) is used as a switching element. In particular, there are two TFTs in the AMOLED device, and one of the two TFTs is a switching TFT for carrying out on and off functions, and the other is a driving TFT for driving a pixel. In general, an N-type metal oxide semiconductor (NMOS) TFT is used as the switching TFT and a P-type MOS (PMOS) TFT is used as the driving TFT.

FIG. 1 is a plan view for schematically illustrating a typical TFT. Referring to FIG. 1, a gate electrode 200 crosses (or perpendicularly crosses or intersects) a center of a polycrystalline silicon layer pattern 100, and a source region 120 and a drain region 130 are formed at respective sides of the gate electrode 200. In addition, a channel region 110 is formed at a crossing (or an intersection) where the polycrystalline silicon layer pattern 100 and the gate electrode 200 cross each other.

A dry etching method is used to form the polycrystalline silicon layer pattern on a substrate at the time of fabricating the TFT. An edge of the polycrystalline silicon layer pattern is exposed to plasma damage during the dry etching process, and the etched edge surface is inclined as compared to a flat top surface of the polycrystalline silicon layer pattern at the time of depositing a subsequent gate insulating layer, so that the connection of the polycrystalline silicon pattern with the gate insulating layer is unstable and poor. An edge channel region and a main channel region have different flat band voltages due to the plasma damage during the dry etching process, which causes the TFT characteristics to be distorted. FIG. 2 is a graph showing current-voltage characteristics of the conventional TFT. An X curve in FIG. 2 shows an ideal current-voltage characteristic of the TFT, whereas a Y curve shows a hump phenomenon in that a channel is inverted at a low gate voltage Vg in low-voltage driving to cause a drain current Id to flow. Such a hump phenomenon causes a problem in that the TFT is turned on sooner than expected due to a concentrated electric field, which causes a display device to which the TFT is applied to mis-operate so that the image quality of the display device is degraded.

SUMMARY OF THE INVENTION

Embodiments of the present invention provide a thin film transistor that is capable of enhancing the driving characteristics of the thin film transistor by forming an uneven structure in a polycrystalline silicon layer pattern and by increasing a channel length at an edge of the channel region; a flat panel display device including the same; and a method of fabricating the same.

In an exemplary embodiment of the present invention, a thin film transistor includes: a semiconductor layer pattern formed on a substrate; a gate electrode crossing (e.g., perpendicularly crossing) a center of the semiconductor layer pattern; source and drain electrodes connected to the semiconductor layer pattern; and a channel region defined by an overlap of the semiconductor layer pattern and the gate electrode, wherein a channel length of an edge of the channel region is different from a channel length of a center of the channel region.

In another exemplary embodiment of the present invention, a thin film transistor includes: a semiconductor layer pattern formed on a substrate and having an uneven structure at an edge of a center of the semiconductor layer pattern; a gate electrode crossing the center of the semiconductor layer pattern; and source and drain electrodes connected to the semiconductor layer pattern.

In yet another exemplary embodiment of the present invention, a flat panel display device includes: a thin film transistor including a semiconductor layer pattern, a gate electrode crossing the semiconductor layer pattern, a channel region defined by a crossing of the semiconductor layer pattern and the gate electrode, and source and drain electrodes connected to the semiconductor layer pattern on a substrate; a pixel electrode connected to one of the source and drain electrode; an organic layer including at least an emission layer and connected to the pixel electrode; and a common electrode (e.g., an upper electrode) connected to the organic layer, wherein a channel length of an edge of the channel region is different from a channel length of a center of the channel region.

In still another exemplary embodiment of the present invention, a method of fabricating a flat panel display device includes: forming a semiconductor layer on a substrate; etching the semiconductor layer using a photolithography process to form a semiconductor layer pattern having an uneven structure at an edge of the semiconductor layer pattern; forming a gate insulating layer on an entire surface of the substrate; forming a gate electrode to cross the semiconductor layer pattern on the gate insulating layer; injecting impurity ions into the semiconductor layer pattern at both sides of the gate electrode to form source and drain regions; forming source and drain electrodes connected to the source and drain regions, respectively; forming a pixel electrode connected to one of the source and drain electrodes; forming an organic layer including at least an emission layer on the pixel electrode; and forming a common electrode on the organic layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. Here, when a first element is connected to/with a second element, the first element may be not only directly connected to/with the second element but also indirectly connected to/with the second element via a third element. Also, when a first element is on/over a second element, the first element may be not only directly on/over the second element but also indirectly on/over the second element via a third element.

Figure 1:
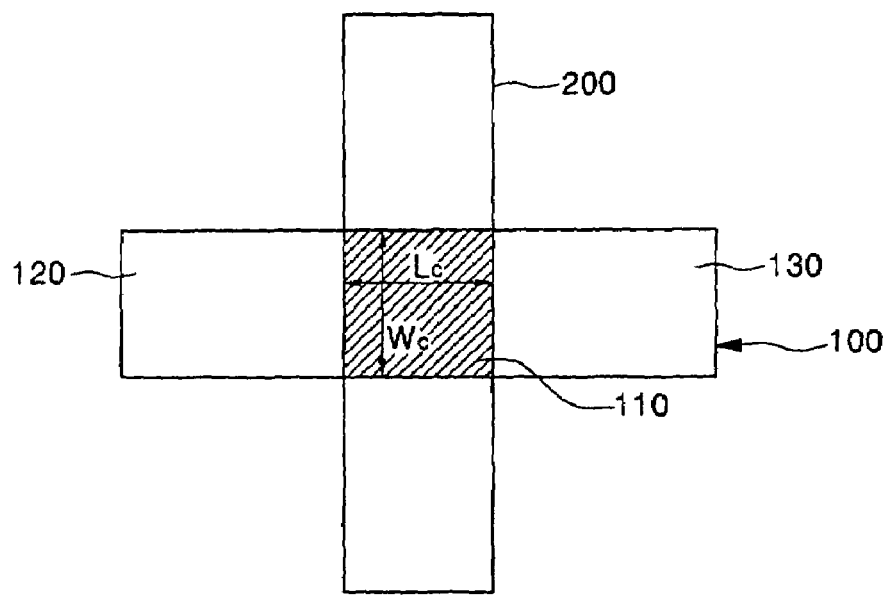
FIG. 1 is a plan view schematically illustrating a typical TFT.
Figure 2:
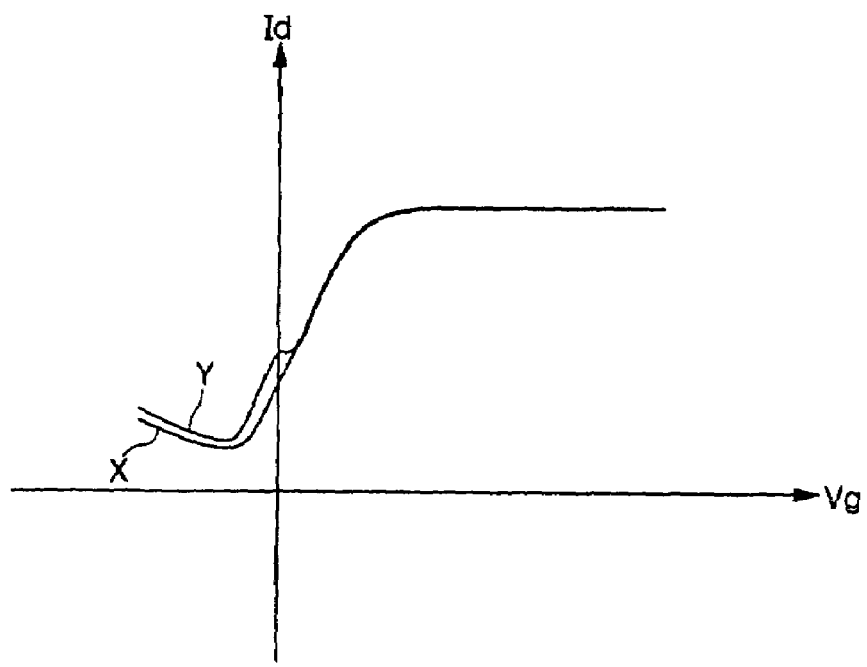
FIG. 2 is a graph showing current-voltage characteristics of a conventional TFT.
Figure 3A:
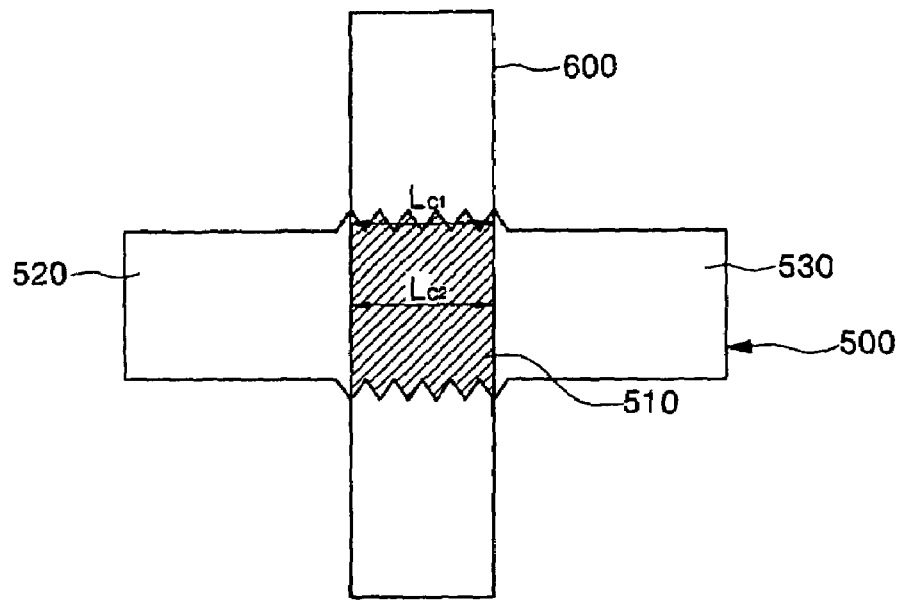
FIGS. 3A to 3C are plan views schematically illustrating a TFT in accordance with exemplary embodiments of the present invention.
Figure 3B:
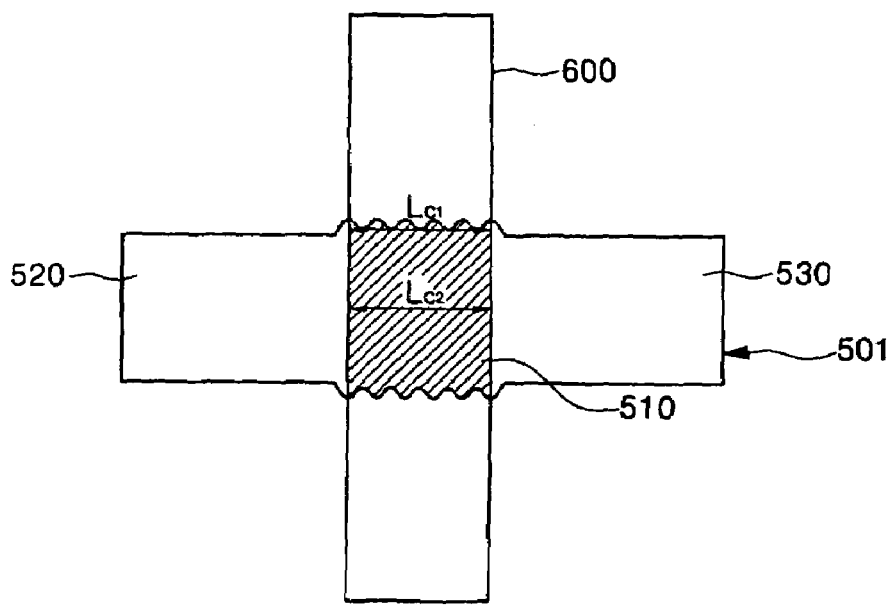
Figure 3C:
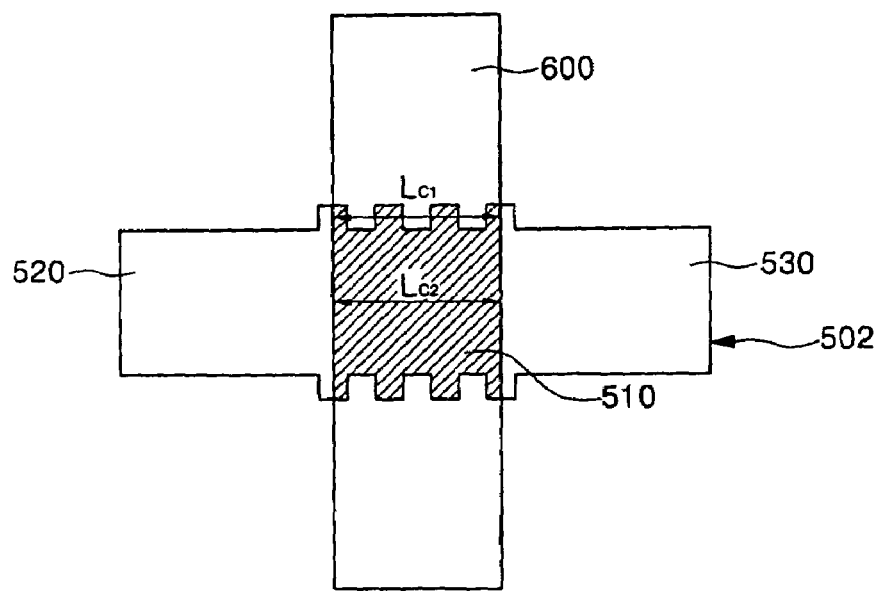

FIGS. 3A to 3C are plan views schematically illustrating a TFT in accordance with exemplary embodiments of the present invention. The embodiments correspond to a case in that an uneven structure is formed in a polycrystalline silicon layer pattern.

In one embodiment, referring to FIG. 3A, a TFT is composed of a polycrystalline silicon layer pattern 500 having source and drain regions 520 and 530, and a gate electrode 600 crossing (or perpendicularly crossing or intersecting) a polycrystalline silicon layer pattern 500, and a channel region 510 is formed at a crossing (or an intersection) between the gate electrode 600 and the polycrystalline silicon layer pattern 500 (or is defined by an overlap of the gate electrode 600 and the polycrystalline silicon layer pattern 500). In addition, the TFT further includes source and drain electrodes connected to the source and drain regions 520 and 530, respectively. In this case, the TFT may be a PMOS TFT or an NMOS TFT.

An uneven structure is formed at an edge of the polycrystalline silicon layer pattern 500 so that a channel length $L_{c1}$ of an edge of the channel region 510 is longer than a channel length $L_{c2}$ of a main channel region (or of a center of the channel region 510). In terms of a straight line distance, the channel length $L_{c2}$ Of the main channel region and the channel length $L_{c1}$ of the edge are the same; however, it can be seen in FIG. 3A that in actuality the channel length $L_{c1}$ of the edge is substantially longer than the channel length $L_{c2}$ of the main channel region. That is, the uneven structured channel (parameter) length $L_{c1}$ is substantially longer than the straight lined channel length $L_{c2}$. In FIG. 3A, the uneven structure of the polycrystalline silicon layer pattern 500 is formed to have one or more pointed parts.

In one embodiment, referring to FIG. 3B, an uneven structure of a polycrystalline silicon layer pattern 501 constituting a TFT is formed in the shape of a sinusoidal wave.

Also, in one embodiment, referring to FIG. 3C, an uneven structure of a polycrystalline silicon layer pattern 502 constituting a TFT is formed to have one or more rectangular parts.

In addition, the present invention is not limited by the above-described shapes, and an uneven structure formed in an polycrystalline silicon layer pattern according to embodiments of the present invention may be formed to have any suitable shapes (e.g., any suitable shapes for increasing actual channel lengths).

Figure 4:
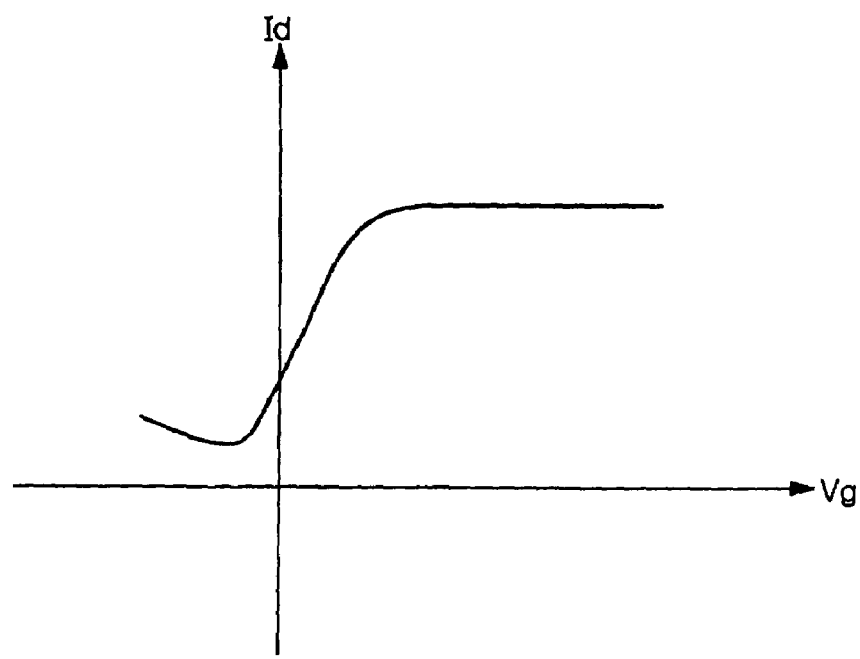
FIG. 4 is a graph showing current-voltage characteristics of a TFT in accordance with an exemplary embodiment of the present invention.

Moreover, a TFT having at least one of the above-described structures may be applied to a flat panel display device, e.g. an OLED device, to control a current at an edge of a channel region, so that an ideal current-voltage characteristic can be obtained as shown in FIG. 4, which thus allows image quality of the flat panel display device to be improved.

Hereinafter, an exemplary method of fabricating a flat panel display device according to an embodiment of the present invention will be described. This exemplary method is limited to fabricating an organic light emitting display device for simplicity of description, but the present invention is not thereby limited.

First, a buffer layer having a predetermined thickness is formed of a silicon oxide on the entire surface of a substrate using a plasma enhanced chemical vapor deposition (PECVD) method. In this case, the buffer layer acts to prevent impurities from diffusing into the substrate at the time of crystallizing an amorphous silicon layer which is to be formed in a subsequent process.

Subsequently, a semiconductor layer having a predetermined thickness is deposited on the buffer layer. The semiconductor layer is an amorphous silicon layer, which is crystallized to form a polycrystalline silicon layer using an excimer laser annealing (ELA) method, a sequential lateral solidification (SLS) method, a metal induced crystallization (MIC) method, and/or a metal induced lateral crystallization (MILC) method.

The polycrystalline silicon layer is then patterned by a photolithography process to form a polycrystalline silicon layer pattern. In one embodiment, the etching of the polycrystalline silicon layer is carried out by a dry etching method which has a good etching uniformity and a small line width loss due to etching.

Alternatively, according to other embodiments of the present invention, an etch mask is patterned, and etching is carried out such that an uneven structure is formed at a part to be used as a channel region at the time of the photolithography process of the polycrystalline silicon layer, which thus allows a length of an edge of the polycrystalline silicon layer pattern to increase.

Subsequently, a gate insulating layer is formed on the entire surface of the substrate. In this case, the gate insulating layer may be formed of a silicon oxide layer ($SiO_2$), a silicon nitride layer ($SiN_x$), or a stacked layer thereof.

A conductive layer for forming a gate electrode is then formed on the gate insulating layer.

The conductive layer is then etched by a photolithography process to form a gate electrode.

Impurities are then injected into the polycrystalline silicon layer pattern at both sides of the gate electrode to form source and drain regions.

An interlayer-insulating layer having a predetermined thickness is formed on the entire surface of the substrate. In this case, the interlayer-insulating layer is formed of a silicon oxide layer, a silicon nitride layer, or a stacked layer thereof.

The interlayer-insulating layer and the gate insulating layer are then etched by a photolithography process to form a contact hole which exposes the source and drain regions and the gate electrode.

Source and drain electrodes are then formed which are connected to the source and drain regions and the gate electrode via the contact hole.

A pixel electrode is then formed which is connected to one electrode of the source and drain electrodes, for example, the drain electrode.

An emission region is defined in the pixel electrode, and an organic layer including at least an emission layer and a common (or upper) electrode are formed. Then, the resultant structure is encapsulated by an encapsulation substrate to complete fabrication of the flat panel display device.

Figure 5:
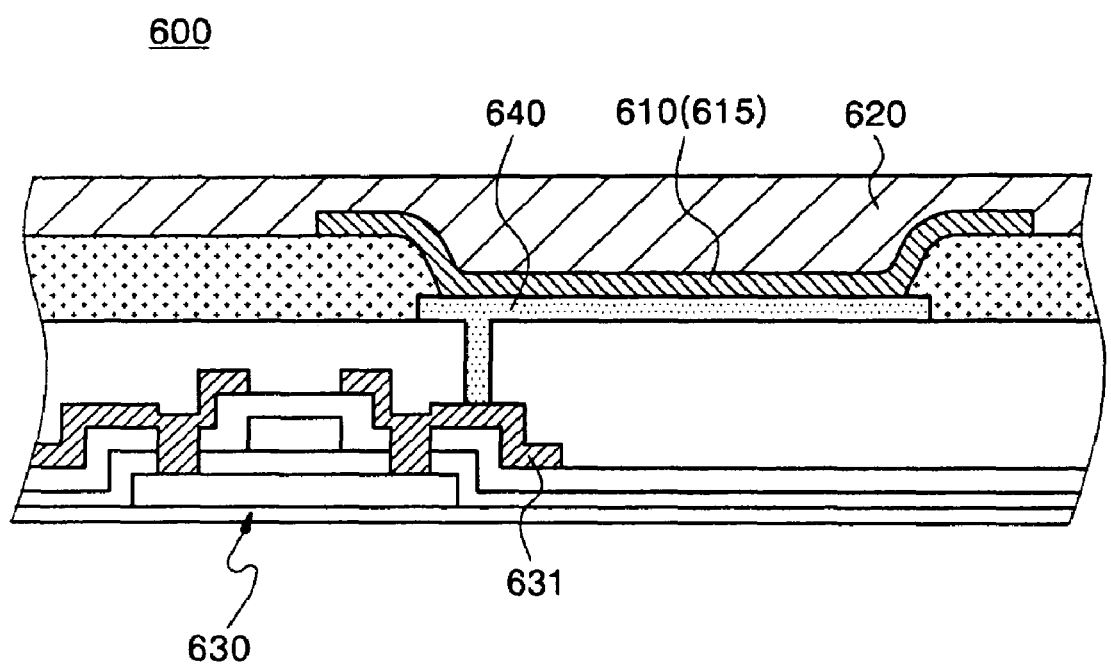
FIG. 5 is a flat panel display including a TFT in accordance with an exemplary embodiment of the present invention.

In one embodiment, as shown in FIG. 5, a flat panel display device 600 that can be formed by the above-described method includes a TFT 630 having a channel region and a drain electrode 631. In FIG. 5, the flat panel display device 600 also includes a pixel electrode 640 connected to the drain electrode 631, and an organic layer 610 connected to the pixel electrode 610 and a common (or upper electrode) 620. Here, the organic layer 610 includes at least an emission layer 615.

According to the embodiments of the present invention as described above, an uneven structure is formed at an edge of a channel region of a polycrystalline silicon layer pattern to form a channel length at the edge of the channel region longer than a main channel length of a center of the channel region so that current can be effectively controlled, which can prevent degradations of driving elements so that the operating characteristics of a flat panel display device can be enhanced.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A thin film transistor, comprising:
a semiconductor layer pattern on a substrate;
a gate electrode having a flat top surface crossing a center of the semiconductor layer pattern;
source and drain electrodes connected to the semiconductor layer pattern; and
a channel region defined by an overlap of the semiconductor layer pattern and the gate electrode,
wherein a channel length of a side edge of the channel region is different from a channel length of a center of the channel region, the side edge of the channel region comprising a plurality of indentations, and
wherein the channel length of the center of the channel region is substantially the same as a width of the gate electrode.

2. The thin film transistor according to claim 1, wherein the channel length of the edge of the channel region is longer than the channel length of the center.

3. The thin film transistor according to claim 1, wherein the semiconductor layer pattern comprises an uneven structure at an edge of a center of the semiconductor layer pattern.

4. The thin film transistor according to claim 3, wherein the uneven structure is formed to correspond to the edge of the channel region.

5. The thin film transistor according to claim 3, wherein the uneven structure comprises a pointed part.

6. The thin film transistor according to claim 3, wherein the uneven structure is formed in a shape of a sinusoidal wave.

7. The thin film transistor according to claim 3, wherein the uneven structure comprises a rectangular part.

8. A thin film transistor, comprising:
a semiconductor layer pattern on a substrate and having a plurality of indentations at an edge of a center of the semiconductor layer pattern;
a gate electrode having a flat top surface crossing the center of the semiconductor layer pattern forming a channel region; and
source and drain electrodes connected to the semiconductor layer pattern, and
wherein a channel length of a center of the channel region is substantially the same as a width of the gate electrode.

9. The thin film transistor according to claim 8, wherein the uneven structure is formed at a crossing of the semiconductor layer pattern and the gate electrode.

10. The thin film transistor according to claim 8, wherein the uneven structure comprises a pointed part.

11. The thin film transistor according to claim 8, wherein the uneven structure is formed in a shape of a sinusoidal wave.

12. The thin film transistor according to claim 8, wherein the uneven structure comprises a rectangular part.

13. The thin film transistor according to claim 8, wherein the thin film transistor is a P-type metal oxide semiconductor (PMOS) thin film transistor or an N-type MOS (NMOS) thin film transistor.

14. A flat panel display device, comprising:
a thin film transistor including a semiconductor layer pattern, a gate electrode having a flat top surface crossing the semiconductor layer pattern, a channel region defined by a crossing of the semiconductor layer pattern and the gate electrode, and source and drain electrodes connected to the semiconductor layer pattern on a substrate;
a pixel electrode connected to one of the source and drain electrodes;
an organic layer including at least an emission layer and connected to the pixel electrode; and
a common electrode connected to the organic layer,
wherein a channel length of a side edge of the channel region is different from a channel length of a center of the channel region, the side edge of the channel region comprising a plurality of indentations, and
wherein the channel length of the center of the channel region is substantially the same as a width of the gate electrode.

15. The flat panel display device according to claim 14, wherein an uneven structure is formed at an edge of a center of the semiconductor layer pattern such that the channel length of the edge of the channel region is longer than the channel length of the center of the channel region.

16. The flat panel display device according to claim 14, wherein the thin film transistor is a P-type metal oxide semiconductor (PMOS) thin film transistor or an N-type MOS (NMOS) thin film transistor.

* * * * *